US010845391B2

(12) United States Patent
Hamrita et al.

(10) Patent No.: US 10,845,391 B2
(45) Date of Patent: Nov. 24, 2020

(54) ELECTRONIC AMPLIFICATION DEVICE, MEASUREMENT APPARATUS AND ASSOCIATED MEASUREMENT METHOD

(71) Applicant: COMMISSARIAT A L'ENERGIE ATOMIQUE ET AUX ENERGIES ALTERNATIVES, Paris (FR)

(72) Inventors: Hassen Hamrita, Champlan (FR); Jean-Michel Bourbotte, Aunay sous Auneau (FR); Vladimir Kondrasovs, Palaiseau (FR); Hamid Makil, Chilly-Mazarin (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 96 days.

(21) Appl. No.: 16/330,485

(22) PCT Filed: Sep. 5, 2017

(86) PCT No.: PCT/FR2017/052339
§ 371 (c)(1),
(2) Date: Mar. 5, 2019

(87) PCT Pub. No.: WO2018/046830
PCT Pub. Date: Mar. 15, 2018

(65) Prior Publication Data
US 2019/0204360 A1 Jul. 4, 2019

(30) Foreign Application Priority Data

Sep. 6, 2016 (FR) .................... 16 58273

(51) Int. Cl.
*G01R 15/08* (2006.01)
*H03G 1/00* (2006.01)
(Continued)

(52) U.S. Cl.
CPC .......... *G01R 15/08* (2013.01); *G01R 15/002* (2013.01); *H03F 3/68* (2013.01); *H03F 3/72* (2013.01);
(Continued)

(58) Field of Classification Search
CPC .. G01R 15/08; G01R 15/002; G01R 19/0023; G01R 19/0061; H03G 2201/506
See application file for complete search history.

(56) References Cited

U.S. PATENT DOCUMENTS

| 4,692,693 A | 9/1987 | Rabeyrolles |
| 5,724,037 A * | 3/1998 | Lee .................... H03H 17/0289 341/143 |

(Continued)

FOREIGN PATENT DOCUMENTS

EP  0155197 A1  9/1985

OTHER PUBLICATIONS

International Search Report for PCT/FR2017/052339 dated Dec. 15, 2017.
(Continued)

*Primary Examiner* — Dominic E Hawkins
(74) *Attorney, Agent, or Firm* — Pearne & Gordon LLP (57) ABSTRACT

An amplification device including: a switch including an output that is suitable for being connected to a first or a second input; a first branch that is connected to the first input, which applies a first gain to generate a first amplified signal; a second branch that is connected to the second input, which applies a second gain to generate a second amplified signal; a controller for controlling the switching of the switch to apply the first or the second amplified signal to the output, depending on whether or not the value of a predetermined quantity of the first amplified signal falls within a
(Continued)

predetermined range. The first gain and the second gain being non-zero real numbers of opposite sign.

7 Claims, 3 Drawing Sheets

(51) Int. Cl.
    *H03F 3/72*        (2006.01)
    *G01R 15/00*     (2006.01)
    *H03F 3/68*        (2006.01)
    *G01R 19/00*     (2006.01)

(52) U.S. Cl.
    CPC ....... *H03G 1/0088* (2013.01); *G01R 19/0023* (2013.01); *G01R 19/0061* (2013.01); *H03F 2200/393* (2013.01); *H03F 2200/417* (2013.01); *H03F 2200/462* (2013.01); *H03F 2200/78* (2013.01); *H03F 2203/7236* (2013.01); *H03F 2203/7239* (2013.01); *H03G 2201/506* (2013.01)

(56) References Cited

U.S. PATENT DOCUMENTS

| | | |
|---|---|---|
| 2003/0095058 A1 | 5/2003 | Matsumoto et al. |
| 2008/0143320 A1 | 6/2008 | Nicholson |
| 2010/0219883 A1* | 9/2010 | Jones ................. H03H 11/0422 327/553 |
| 2011/0029109 A1* | 2/2011 | Thomsen ............ H03F 3/45475 700/94 |
| 2011/0068866 A1* | 3/2011 | Kishii .................. H03F 1/0211 330/129 |
| 2013/0009655 A1 | 1/2013 | Marten |
| 2013/0129117 A1* | 5/2013 | Thomsen ................ H04R 3/00 381/111 |

OTHER PUBLICATIONS

Written Opinion for PCT/FR2017/052339 dated Dec. 15, 2017.
Search Report for French Application No. FR1658273 dated Jul. 14, 2017.

* cited by examiner

ELECTRONIC AMPLIFICATION DEVICE, MEASUREMENT APPARATUS AND ASSOCIATED MEASUREMENT METHOD

CROSS-REFERENCE TO RELATED APPLICATIONS

This is a National Stage application of PCT international application PCT/FR2017/052339, filed on Sep. 5, 2017, which claims the priority of French Patent Application No. 16 58273, filed Sep. 6, 2016, both of which are incorporated herein by reference in their entireties.

TECHNICAL FIELD

The present invention relates to an amplification device. The invention also relates to a measurement apparatus and a measurement method.

The invention is applied to the measurement of a characteristic of an electric signal. In particular, the invention is applied to the measurement of direct currents with very low intensity, for example to the measurement of direct currents having a very low intensity from ionising radiation detectors.

STATE OF PRIOR ART

Following the Fukushima accident, the measurement of neutron flux and gamma flux on so-called "third generation" reactors gained in importance. But, in a reactor building, the neutron flux is likely to vary between a few $10 n \cdot cm^{-2} \cdot s^{-1}$ (neutrons per square centimeter and per second) and a few $10^{14} n \cdot cm^{-2} \cdot s^{-1}$, and the gamma flux of a few $10^2$ to $10^{11}$ gamma$\cdot cm^{-2} \cdot s^{-1}$.

Among the different types of radiation detectors, collectrons, also known as SPND (Self Powered Neutron Detector) and ionisation chambers are currently the only detectors able to make measurements on such a range.

Collectrons have the advantage of operating without a power source. Indeed, in such a detector, the interaction of neutrons or gamma photons with the materials of the detector generates electrons. The movement of these electrons in the detector generates a direct electric current the intensity of which is proportional to the gamma flux or to the neutron flux detected. Such a current has generally an intensity between 1 pA (picoampere) and a few 10 mA (milliampere), depending on the detected radiation flow. The electric current generated by a collectron thus has a large dynamics, that is a dynamics in the order of $10^{10}$.

By "dynamics", it is intended, for the purposes of the present invention, the ratio between the extreme values reached by a physical quantity, for example reached by the electric current generated by a collectron.

By "large dynamics", it is generally intended a dynamics higher than or equal to $10^4$.

The current generated by a collectron being likely to have relatively low values, such a current requires to be amplified before being measured.

It is known to use linear amplifiers to amplify an electric current. However, linear current amplifiers available in the market are prone to saturation phenomena which make such amplifiers unsuitable for amplifying electric signals having a large dynamics.

Document EP 0155197 A1 describes a logarithmic amplifier able to amplify electric currents having a large dynamics.

However, such an amplifier is not fully satisfactory.

Indeed, such a logarithmic amplifier is inaccurate, because it resorts to a logarithmic transformation. Further, the operation of such a logarithmic amplifier relies on the use of diodes. But, diodes have a low temperature stability, which is detrimental to the temperature stability of such a logarithmic amplifier.

One purpose of the invention is thus to provide an amplification device which has less saturation risks for electric signals having a large dynamics and the sign of which is predetermined, and which is more temperature stable and more accurate than amplifiers of the state of the art.

DISCLOSURE OF THE INVENTION

To that end, one object of the invention is an amplification device, which includes an intermediate terminal for receiving an intermediate signal, an output terminal and an amplification stage connected between the intermediate terminal and the output terminal.

The amplification stage comprises:
- a switch including an output connected to the output terminal, a first input and a second input, the switch being able to switch between a first position, in which the output is connected to the first input, and a second position, in which the output is connected to the second input;
- a first branch connected between the intermediate terminal and the first input of the switch, the first branch being configured to apply a first gain to the intermediate signal in order to generate a first amplified signal for being delivered to the first input of the switch;
- a second branch connected between the intermediate terminal and the second input of the switch, the second branch being configured to apply a second gain to the intermediate signal in order to generate a second amplified signal for being delivered to the second input of the switch;
- a controller configured to control switching of the switch:
  - in the first position to apply the first amplified signal to the output terminal, if the value of a predetermined quantity of the first amplified signal belongs to a predetermined range;
  - in the second position to apply the second amplified signal to the output terminal, if the value of the predetermined quantity of the first amplified signal is outside the predetermined range.

The first gain and the second gain are non-null real numbers having opposite signs.

Indeed, in such an amplification device, the amplification stage is able to amplify:
- a first current range, corresponding to an intensity range for which the first gain is applied, and for which the components of the first branch do not become saturated; and
- a second current range, corresponding to an intensity range for which the second gain supplied, and for which the components of the second branch do not become saturated.

Switching between the first range and the second range is automatically made by controlling the switch. For such a switching between the first branch and the second branch of the amplification stage, a large current dynamics of the input signal is covered, and saturation problems are avoided.

Further, the output signal has a sign which only depends on the gain applied and the predetermined sign of the intermediate signal. Thus, the switch position is coded by the sign of the output signal. That simplifies automatic decoding of the output signal: indeed, the sign of the output signal automatically indicates which gain has been applied.

By predetermined sign of a signal, it should be intended that the sign of the signal is predetermined at a given instant. Thus, in the case of the use mainly aimed at by the invention where said signal is a continuous signal, as is the case for signals from collectrons, the sign of the signal corresponds to the sign expected for said signal (generally positive). In the case where the signal is a signal having a sign that can vary, the sign is predetermined at a given instant, either for an upstream measurement, or for a predictable variation of the signal.

According to other advantageous aspects of the invention, the amplification device includes one or more of the following characteristics, taken alone or according to any technically possible combinations:
it further includes an input terminal and a preamplifier connected between the input terminal and the intermediate terminal, the preamplifier being configured to apply a preliminary gain to an input signal received from the input terminal to generate the intermediate signal for being delivered to the intermediate terminal, the preliminary gain being a non-null real number;
the second branch of the amplification stage has a unity gain.

Further, one object of the invention is a current measurement apparatus which comprises an amplification device according to the invention, as well as a calculator connected to the output terminal of the amplification device, the calculator being configured to calculate a value of a predetermined characteristic of an intermediate signal having a predetermined sign received by the intermediate terminal of the measurement apparatus equal:
if the intermediate signal is positive, to:
the value of the predetermined quantity of the output signal divided by the first gain, if the value of the predetermined quantity of the output signal is of the same sign as the first gain;
the value of the predetermined quantity of the output signal divided by the second gain, if the value of the predetermined quantity of the output signal is not of the same sign as the first gain;
if the intermediate signal is negative, to:
the value of the predetermined quantity of the output signal divided by the first gain, if the value of the predetermined quantity of the output signal is not of the same sign as the first gain;
the value of the predetermined quantity of the output signal divided by the second gain, if the value of the predetermined quantity of the output signal is of the same sign as the first gain.

Further, one object of the invention is a current measurement method.

BRIEF DESCRIPTION OF THE DRAWINGS

The invention will be better understood upon reading the description that follows, given only by way of non-limiting example and made in reference to the appended drawings in which.

DETAILED DISCLOSURE OF PARTICULAR EMBODIMENTS

Figure 1:
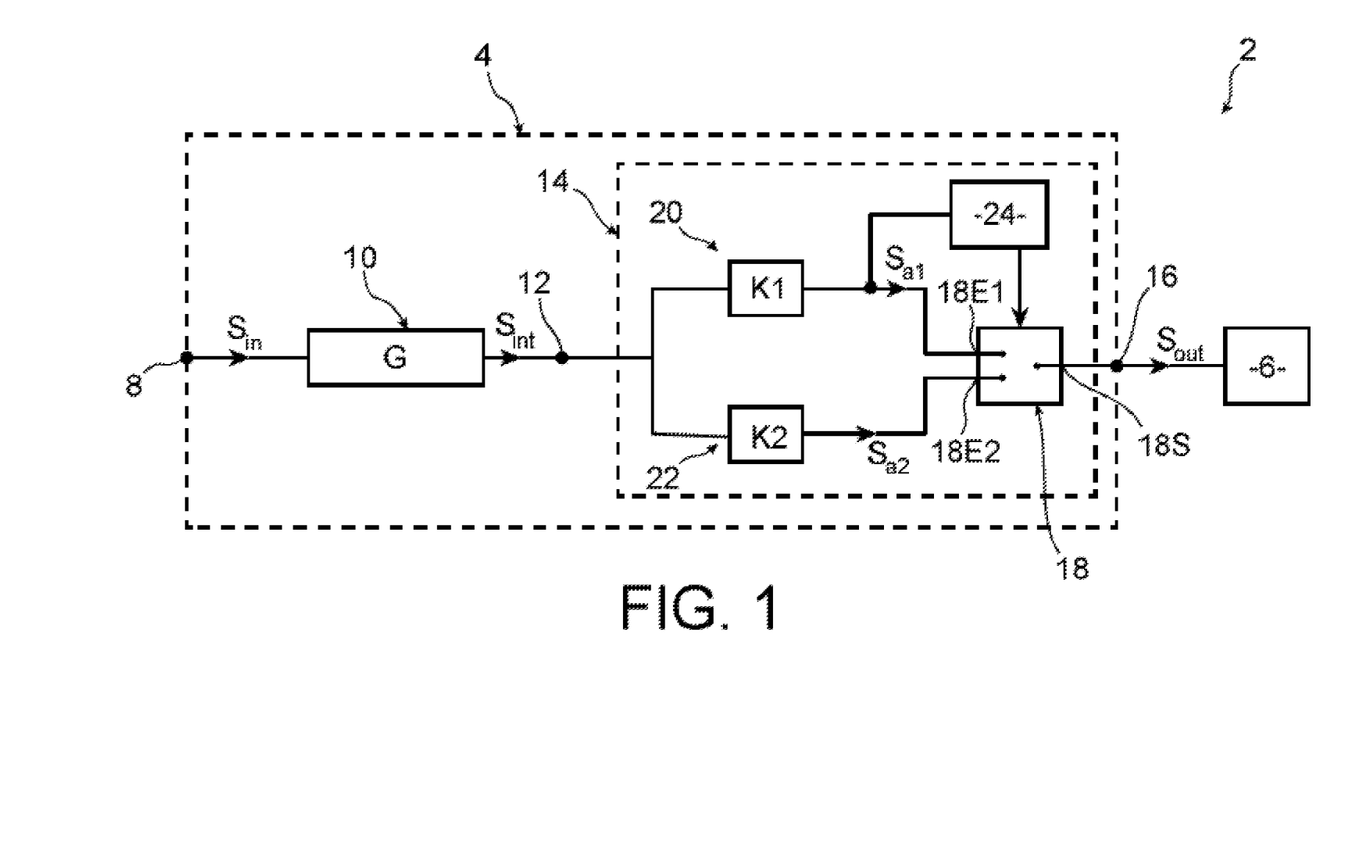
FIG. 1 is a schematic representation of a measurement apparatus according to the invention.

A measurement apparatus 2 according to the invention is illustrated by FIG. 1. The measurement apparatus 2 is configured to measure the value of a predetermined characteristic of an electric signal. For example, the measurement apparatus 2 is a current measurement apparatus, in particular a current measurement apparatus for direct electric currents the intensity of which has a large dynamics and is also likely to reach relatively low values, such as direct electric currents with a very small intensity from radiation and particle detectors, for example from ionisation chambers or collectrons.

By "current with a very low intensity", it is intended, for the purposes of the present invention, an electric current having an intensity lower than or equal to a few tens of picoamperes, for example lower than or equal to 10 pA (picoampere).

The measurement apparatus 2 is able to receive an electric input signal $s_{in}$, and to determine the value of the predetermined characteristic of the input signal $s_{in}$, for example the intensity of the input signal $s_{in}$.

The measurement apparatus 2 comprises an amplification device 4 and a calculator 6.

The amplification device 4 is configured to provide an output signal $s_{out}$ a predetermined quantity of which is representative of the predetermined characteristic of the input signal $s_{in}$. For example, the amplification device 4 is configured to provide an output signal $s_{out}$ the voltage of which is representative of the intensity of the input signal $s_{in}$.

The calculator 6 is connected to the amplification device 4 to receive the output signal $s_{out}$. The calculator 6 is configured to calculate the value of the predetermined characteristic of the input signal $s_{in}$ from the value of the first predetermined quantity of the output signal $s_{out}$.

The amplification device 4 includes an input terminal 8, a preamplifier 10, an intermediate terminal 12, an amplification stage 14 and an output terminal 16.

The preamplifier 10 is connected between the input terminal 8 and the intermediate terminal 12. The amplification stage 14 is connected between the intermediate terminal 12 and the output terminal 16.

The preamplifier 10 is able to receive the input signal $s_{in}$ applied to the input terminal 8. The preamplifier 10 is further configured to apply a preliminary gain G to the input signal $s_{in}$, to deliver an intermediate signal $s_{int}$ to the intermediate terminal 12. The intermediate signal $s_{int}$ is proportional to the input signal $s_{in}$.

The amplification stage 14 is configured to shape the intermediate signal $s_{int}$ in order to provide, at the output terminal 16, the output signal $s_{out}$.

The amplification stage 14 comprises a switch 18, a first branch 20, a second branch 22, and a controller 24.

The switch 18 includes a first input 18E1, a second input 18E2 and an output 18S.

The output 18S of the switch 18 is connected to the output terminal 16.

The first branch 20 of the amplification stage 14 is connected between the intermediate terminal 12 and the first input 18E1 of the switch 18. Further, the second branch 22 of the amplification stage 14 is connected between the intermediate terminal 12 and the second input 18E2 of the switch 18.

The first branch 20 of the amplification stage 14 is able to receive the intermediate signal $s_{int}$ from the intermediate terminal 14. Further, the first branch 20 is configured to apply a first gain K1 to the intermediate signal $s_{int}$ received, to deliver a first amplified signal $s_{a1}$ to the first input 18E1 of the switch 18.

The second branch 22 of the amplification stage 14 is able to receive the intermediate signal $s_{int}$ from the intermediate terminal 14. Further, the second branch 22 is configured to apply a second gain K2 to the intermediate signal $s_{int}$ received, to deliver a second amplified signal $s_{a2}$ to the second input 18E2 of the switch 18.

By "gain", it is intended, for the purposes of the present invention, the result of the division of the value of a given physical quantity of an electronic signal available at the output of an electronic system by the value of the physical quantity of a corresponding signal input to the electronic system. The gain is a positive or negative real number.

The first gain K1 and the second gain K2 are non-null real numbers having opposite signs. The first gain K1 and the preliminary gain G are also non-null real numbers having opposite signs.

The controller 24 is connected to one of the first input 18E1 and the second input 18E2 of the switch 18.

The controller 24 is configured to determine whether the value of the predetermined quantity of the first amplified signal $s_{a1}$ applied to the first input 18E1 of the switch 18, respectively of the second amplified signal $s_{a2}$ applied to the second input 18E2 of the switch 18, belongs to a corresponding allowed range.

For example, in the case where the predetermined quantity is the voltage, the controller 24 is able to determine whether the voltage of the first amplified signal $s_{a1}$, respectively of the second amplified signal $s_{a2}$, belongs to a voltage interval at least one bound of which is a saturation voltage of the first branch 20, respectively of the second branch 22, the saturation voltage being excluded from the interval.

In particular, the controller 24 is able to compare the value of the predetermined quantity of the first amplified signal $s_{a1}$, respectively of the second amplified signal $s_{a2}$, with a predetermined value.

For example, in the case where the predetermined quantity is the voltage, the controller 24 is able to compare the voltage of the first amplified signal $s_{a1}$, respectively of the second amplified signal $s_{a2}$, to a negative low saturation voltage $-V_{sat}$ of the first branch 20, respectively to a positive high saturation voltage $+V_{sat}$ of the second branch 22. In this case, the allowed range corresponds to the voltage values which are strictly higher than the low saturation voltage $-V_{sat}$ of the first branch 20, respectively strictly lower than the high saturation voltage $+V_{sat}$ of the second branch 22.

Such an example will in particular be implemented in the case where the first branch 20 has a low saturation voltage $-V_{sat}$ lower, in absolute value, than the low saturation voltage $-V_{sat}$ of the second branch 22.

The controller 24 is, for example, a known comparator.

Further, in the case where the controller 24 is connected to the first input 18E1 of the switch 18, the controller 24 is configured to control switching of the switch 18:
  into the first position to apply the first amplified signal $s_{a1}$ to the output terminal 16, if the value of the predetermined quantity of the first signal $s_{a1}$ belongs to the corresponding allowed range;
  into the second position to apply the second amplified signal $s_{a2}$ to the output terminal 16, if the value of the predetermined quantity of the first signal $s_{a1}$ is outside the allowed range.

In the case where the controller 24 is connected to the second input 18E2 of the switch 18, the controller 24 is configured to control switching of the switch 18:
  into the second position to apply the second amplified signal $s_{a2}$ to the output terminal 16, if the value of the predetermined quantity of the second signal $s_{a2}$ belongs to the corresponding allowed range;
  into the first position to apply the first amplified signal $s_{a1}$ to the output terminal 16, if the value of the predetermined quantity of the second signal $s_{a2}$ is outside the allowed range.

The calculator 6 is configured to measure the value of the predetermined quantity of the output signal $s_{out}$. Further, the calculator 6 is configured to store the value of each of the preliminary gain G, the first gain K1 and the second gain K2.

The calculator 6 is also configured to calculate the value of the predetermined characteristic of the input signal $s_{in}$ from the value of the predetermined quantity of the output signal $s_{out}$ and the sign of the predetermined quantity of the output signal $s_{out}$. In particular, the calculator calculates a value of the predetermined characteristic of the input signal $s_{in}$ which is equal to the value of the predetermined quantity of the output signal $s_{out}$ divided by the preliminary gain G and by:
  the first gain K1 if the value of the predetermined quantity of the output signal $s_{out}$ is negative;
  the second gain K2 if the value of the predetermined quantity of the output signal $s_{out}$ is positive.

Figure 2:
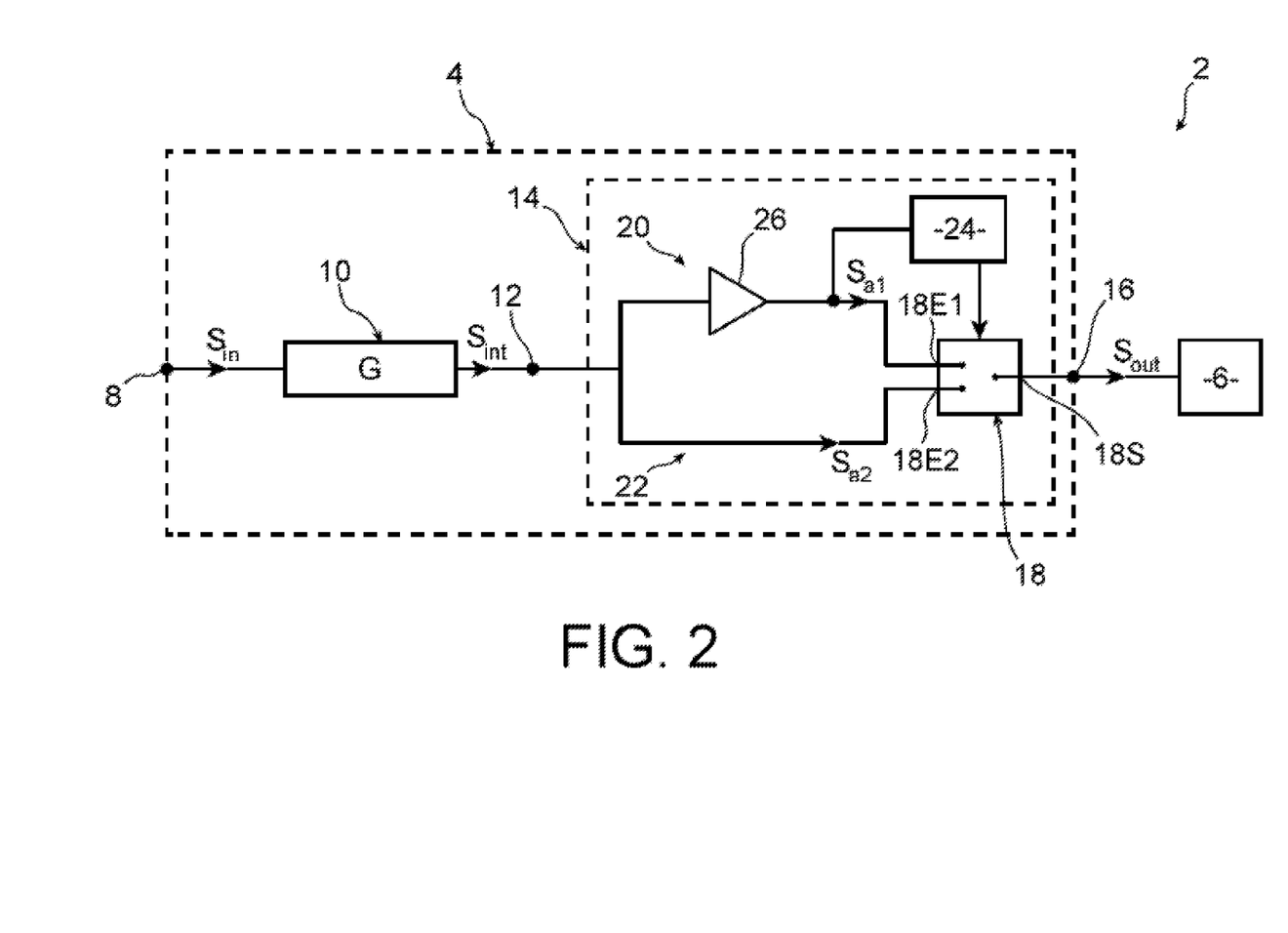
FIG. 2 is a schematic representation of a particular embodiment of the measurement apparatus of FIG. 1.

In the embodiment illustrated by FIG. 2, the measurement apparatus 2 is configured to measure the intensity of the input signal $s_{in}$. Such an input signal $s_{in}$ is in particular a signal delivered by a neutron flux or gamma flux detector, such as a collectron or ionisation chamber.

As represented in FIG. 2, the second branch 22 is a simple electric wire. In this case, the second gain K2 is a unity gain. Further, the preliminary gain G is positive, and the first gain K1 is negative.

For example, the preamplifier 10 is a conventionally known transimpedance amplifier. In this case, the preamplifier 10 advantageously has a preliminary gain G the absolute value of which is higher than or equal to $10^6$ V/A (volt per ampere), preferably higher than or equal to $10^7$ V/A, for example in the order of $10^8$ V/A.

For example, the first branch 20 comprises an amplifier 26 connected in an inverting mounting between the intermediate terminal 12 and the first input 18E1 of the switch 18. In this case, the absolute value of the first gain K1 is equal to the gain of the amplifier 26. Advantageously, the amplifier 26 has a gain higher than or equal to 10, preferably higher than or equal to 50, for example in the order of 100.

Advantageously, the amplifier 26 is a conventionally known operational amplifier with precision instrumentation.

Further, in the embodiment of FIG. 2, the switch 18 is a double switch relay, of the SPDT ("single pole, double throw", also called inverter) type.

The controller 24 is connected to the first input 18E1 of the switch 18.

Further, the controller 24 is a circuit making up a known hysteresis connection mounting. In this case, the controller 24 acts as a comparator configured to compare the voltage of the first amplified signal $s_{a1}$ to a reference voltage equal to the low saturation voltage $-V_{sat}$ of the amplifier 26, for example a reference voltage equal to −10V. In this case, the controller 24 is configured to bias a coil of the switch 18, if the voltage of the first amplified signal $s_{a1}$ reaches −10V, in order to switch the switch 18 into the second position.

The operation of the measurement apparatus 2 will now be described, based on the embodiment of FIG. 2, and in reference to FIG. 3.

In this example, the input signal $s_{in}$ is positive, that is the intensity of the input signal $s_{in}$ is positive.

The preamplifier 10 has a preliminary gain G equal to $10^8$ V/A.

The amplifier 26 has a gain equal to 100. In this case, the first branch 22 has a first gain K1 equal to −100.

The low saturation voltage $-V_{sat}$ of the amplifier 26 is equal −10V.

The measurement apparatus 2 is connected to a detector to receive the input signal $s_{in}$ formed by a direct current having an intensity between 1 pA and 100 nA.

If the intensity of the input signal $s_{in}$ belongs to the interval [1 pA; 1 nA[, then the intermediate signal $s_{int}$ has a voltage belonging to the interval [100 µV; 100 mV[.

The intermediate signal $s_{int}$ passes through the first branch 20. The first amplified signal $s_{a1}$ available at the first input 18E1 of the switch 18 has a voltage belonging to the interval [−10V; −10 mV].

The voltage of the first amplified signal $s_{a1}$ being strictly higher than the low saturation voltage $-V_{sat}$ of the amplifier 26, the controller 24 controls the switch 18 such that the switch 18 is placed in the first position, that is the position in which the first input 18E1 of the switch 18 is electrically connected to the output 18S of the switch 18. In this case, the output signal $s_{out}$ is equal to the first amplified signal $s_{a1}$.

Figure 3:
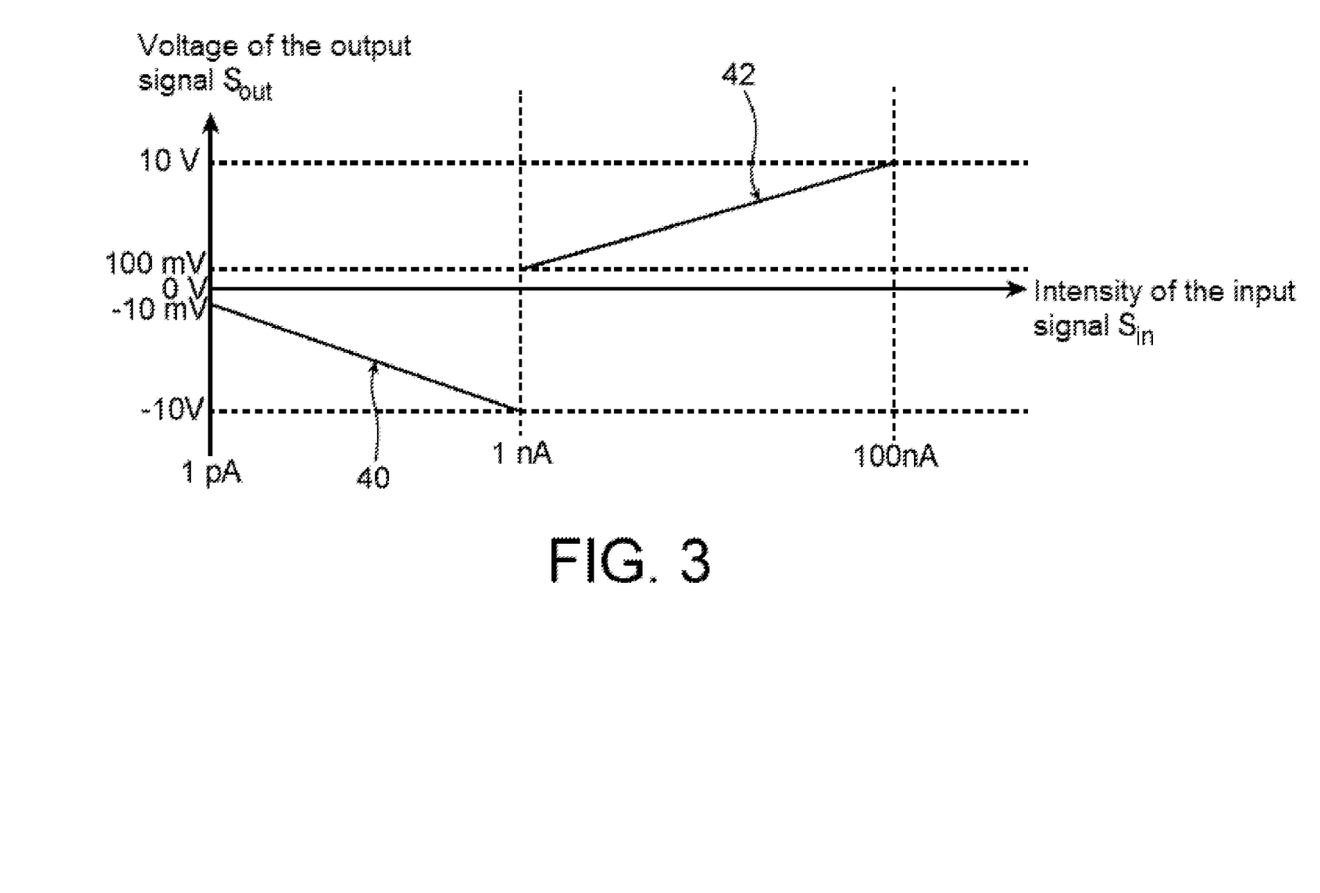
FIG. 3 is a graph representing the time change of an output signal of an amplification device of the measurement apparatus of FIG. 2, as a function of an input signal of the current measurement apparatus.

The time change of the voltage of the output signal $s_{out}$ for an input signal $s_{in}$ having an intensity belonging to the interval [1 pA; 1 nA[ is illustrated by the segment 40 of the graph of FIG. 3.

Since the voltage of the output signal $s_{out}$ is negative, the calculator 6 calculates an intensity of the input signal $s_{in}$ equal to the voltage of the output signal $s_{out}$ divided by the product of the preliminary gain G and the first gain K1, that is divided by $-10^{10}$ V/A.

As soon as the intensity of the input signal $s_{in}$ reaches 1 pA, that is as soon as the voltage of the first amplified signal $s_{a1}$ reaches −10V, the controller 24 controls switching of the switch 18 into the second position, that is the position in which the second input 18E2 of the switch 18 is electrically connected to the output 18S of the switch 18. In this case, the output signal $s_{out}$ is equal to the second amplified signal $s_{a2}$. Since the second branch 22 is, in the example, a simple wire, the second amplified signal $s_{a2}$ is the intermediate signal $s_{int}$.

The controller 24 controls the switch 18 such that the switch 18 is placed into the second position for all the intensity values of the input signal $s_{in}$ likely to saturate the amplifier 26, that is for all the intensity values of the input signal $s_{in}$ belonging to the interval [1 nA; 100 nA].

The time change of the voltage of the output signal $s_{out}$ for an input signal $s_{in}$ having an intensity belonging to the interval [1 nA; 100 nA] is illustrated by the segment 42 of the graph of FIG. 3.

As appears in FIG. 3, in this case, the voltage of the output signal $s_{out}$ ranges from 100 mV to 10V.

Since the voltage of the output signal $s_{out}$ is positive, the calculator 6 calculates an intensity of the input signal $s_{in}$ equal to the voltage of the output signal $s_{out}$ divided by the product of the preliminary gain G and the second gain K2, that is divided by $10^8$ V/A.

According to an alternative not represented, the preamplifier 10 is a simple electric wire. In this case, the preliminary gain G is 1. Further, the input terminal 8 and the intermediate terminal 12 are one and a same.

What is claimed is:

1. An amplification device including an intermediate terminal for receiving an intermediate signal, an output terminal and an amplification stage, the amplification stage being connected between the intermediate terminal and the output terminal,
    wherein the amplification stage comprises:
        a switch including an output connected to the output terminal, a first input and a second input, the switch being configured to switch between a first position, in which the output is connected to the first input, and a second position, in which the output is connected to the second input;
        a first branch connected between the intermediate terminal and the first input of the switch, the first branch being configured to apply a first gain to the intermediate signal in order to generate a first amplified signal to be delivered to the first input of the switch;
        a second branch connected between the intermediate terminal and the second input of the switch, the second branch being configured to apply a second gain to the intermediate signal in order to generate a second amplified signal to be delivered to the second input of the switch;
        a controller configured to control switching of the switch:
            in the first position to apply the first amplified signal to the output terminal, if a value of a predetermined quantity of the first amplified signal belongs to a predetermined range;
            in the second position to apply the second amplified signal to the output terminal, if the value of the predetermined quantity of the first amplified signal is outside the predetermined range;
        the first gain and the second gain being non-null real numbers having opposite signs.

2. The amplification device according to claim 1, further including an input terminal and a preamplifier connected between the input terminal and the intermediate terminal,
    the preamplifier being configured to apply a preliminary gain to an input signal received from the input terminal to generate the intermediate signal to be delivered to the intermediate terminal,
    the preliminary gain being a non-null real number.

3. The amplification device according to claim 2, wherein the second branch of the amplification stage has a unity gain.

4. A measurement apparatus, including an amplification device according to claim 2, and a calculator connected to the output terminal of the amplification device,
    the calculator being configured to calculate a value of a predetermined characteristic of the input signal received by the input terminal of the amplification device, the input signal having a predetermined sign, the value of the predetermined characteristic of the input signal being equal:
        if the input signal is positive, to:
            the value of the predetermined quantity of an output signal output by the output terminal, divided by the preliminary gain and by the first gain, if the value of the predetermined quantity of the output signal is of the same sign as the product of the preliminary gain and the first gain;
            the value of the predetermined quantity of the output signal divided by the preliminary gain and by the second gain, if the value of the predetermined quantity of the output signal is not of the same sign as the product of the preliminary gain and the first gain;

if the input signal is negative, to:

the value of the predetermined quantity of the output signal divided by the preliminary gain and by the first gain, if the value of the predetermined quantity of the output signal is not of the same sign as the product of the preliminary gain and the first gain;

the value of the predetermined quantity of the output signal divided by the preliminary gain and by the second gain, if the value of the predetermined quantity of the output signal is of the same sign as the product of the preliminary gain and the first gain.

5. A measurement apparatus, comprising an amplification device according to claim 1, and a calculator connected to the output terminal of the amplification device, the calculator being configured to calculate a value of a predetermined characteristic of the intermediate signal received by the intermediate terminal of the amplification device, the intermediate signal having a predetermined sign, the value of the predetermined characteristic of the intermediate signal being equal:

if the intermediate signal is positive, to:

the value of the predetermined quantity of an output signal output by the output terminal, divided by the first gain, if the value of the predetermined quantity of the output signal is of the same sign as the first gain;

the value of the predetermined quantity of the output signal divided by the second gain, if the value of the predetermined quantity of the output signal is not of the same sign as the first gain;

if the intermediate signal is negative, to:

the value of the predetermined quantity of the output signal divided by the first gain, if the value of the predetermined quantity of the output signal is not of the same sign as the first gain;

the value of the predetermined quantity of the output signal divided by the second gain, if the value of the predetermined quantity of the output signal is of the same sign as the first gain.

6. A method for measuring a value of a predetermined characteristic of an intermediate signal having a predetermined sign, the intermediate signal being applied to an intermediate terminal of an amplification device, the amplification device further including an output terminal and an amplification stage, the amplification stage being connected between the intermediate terminal and the output terminal, wherein the amplification stage comprises:

a switch including an output connected to the output terminal, a first input and a second input, the switch being configured to switch between a first position, in which the output is connected to the first input, and a second position, in which the output is connected to the second input;

a first branch connected between the intermediate terminal and the first input of the switch, the first branch being configured to apply a first gain to the intermediate signal in order to generate a first amplified signal to be delivered to the first input of the switch;

a second branch connected between the intermediate terminal and the second input of the switch, the second branch being configured to apply a second gain to the intermediate signal in order to generate a second amplified signal to be delivered to the second input of the switch;

a controller configured to control switching of the switch:

in the first position to apply the first amplified signal to the output terminal, if a value of a predetermined quantity of the first amplified signal belongs to a predetermined range, the first amplified signal forming an output signal;

in the second position to apply the second amplified signal to the output terminal, if the value of the predetermined quantity of the first amplified signal is outside the predetermined range, the second amplified signal forming the output signal;

the first gain and the second gain being non-null real numbers having opposite signs, the method including the steps of:

measuring the value of the predetermined quantity of the output signal;

calculating the value of the predetermined characteristic of the intermediate signal, the value of the predetermined characteristic of the intermediate signal being equal:

if the intermediate signal is positive, to:

the value of the predetermined quantity of the output signal divided by the first gain, if the value of the predetermined quantity of the output signal is of the same sign as the first gain;

the value of the predetermined quantity of the output signal divided by the second gain, if the value of the predetermined quantity of the output signal is not of the same sign as the first gain;

if the intermediate signal is negative, to:

the value of the predetermined quantity of the output signal divided by the first gain, if the value of the predetermined quantity of the output signal is not of the same sign as the first gain;

the value of the predetermined quantity of the output signal divided by the second gain, if the value of the predetermined quantity of the output signal is of the same sign as the first gain.

7. A method for measuring a value of a predetermined characteristic of an input signal having a predetermined sign, the input signal being applied to an input terminal of an amplification device, the amplification device further including a preamplifier, an intermediate terminal, an amplification stage and an output terminal, the preamplifier being connected between the input terminal and the intermediate terminal, the amplification stage being connected between the intermediate terminal and the output terminal, the preamplifier being configured to apply a preliminary gain to the input signal to generate an intermediate signal to be delivered to the intermediate terminal, the preliminary gain being a non-null real number the amplification stage comprising:

a switch including an output connected to the output terminal, a first input and a second input, the switch being configured to switch between a first position, in which the output is connected to the first input, and a second position, in which the output is connected to the second input;

a first branch connected between the intermediate terminal and the first input of the switch, the first branch being configured to apply a first gain to the intermediate signal in order to generate a first amplified signal to be delivered to the first input of the switch;

a second branch connected between the intermediate terminal and the second input of the switch, the second branch being configured to apply a second gain to the intermediate signal in order to generate a second amplified signal to be delivered to the second input of the switch;

a controller configured to control switching of the switch:

in the first position to apply the first amplified signal to the output terminal, if the value of a predetermined quantity of the first amplified signal belongs to a predetermined range, the first amplified signal forming an output signal;

in the second position to apply the second amplified signal to the output terminal, if the value of the predetermined quantity of the first amplified signal is outside the predetermined range, the second amplified signal forming the output signal;

the first gain and the second gain being non-null real numbers having opposite signs, the method including the steps of:

measuring the value of the predetermined quantity of the output signal;

calculating the value of the predetermined characteristic of the input signal, the value of the predetermined characteristic of the input signal being equal:

if the input signal is positive, to:

the value of the predetermined quantity of the output signal divided by the preliminary gain and by the first gain, if the value of the predetermined quantity of the output signal is of the same sign as the product of the preliminary gain and the first gain;

the value of the predetermined quantity of the output signal divided by the preliminary gain and by the second gain, if the value of the predetermined quantity of the output signal is not of the same sign as the product of the preliminary gain and the first gain;

if the input signal is negative, to:

the value of the predetermined quantity of the output signal divided by the preliminary gain and by the first gain, if the value of the predetermined quantity of the output signal is not of the same sign as the product of the preliminary gain and the first gain;

the value of the predetermined quantity of the output signal divided by the preliminary gain and by the second gain, if the value of the predetermined quantity of the output signal is of the same sign as the product of the preliminary gain and the first gain.

* * * * *